United States Patent [19]

Jackson et al.

[11] Patent Number: 5,523,071
[45] Date of Patent: Jun. 4, 1996

[54] METHOD FOR ENHANCING THE TOUGHNESS OF MANUFACTURED DIAMOND

[75] Inventors: William E. Jackson, Dublin, Ohio; Dong-Sil Park, Schenectady, N.Y.

[73] Assignee: General Electric Company, Worthington, Ohio

[21] Appl. No.: 415,225

[22] Filed: Mar. 31, 1995

Related U.S. Application Data

[63] Continuation of Ser. No. 105,537, Aug. 11, 1993, abandoned.

[51] Int. Cl.⁶ ................................................ C01B 31/06
[52] U.S. Cl. ................................................ 423/446; 264/85
[58] Field of Search ............................ 423/446; 264/85

[56] References Cited

U.S. PATENT DOCUMENTS

| | | | |
|---|---|---|---|
| 4,034,066 | 7/1977 | Strong et al. | 423/446 |
| 4,124,690 | 11/1978 | Strong et al. | 423/446 |
| 4,174,380 | 11/1979 | Strong et al. | 423/446 |
| 5,035,771 | 7/1991 | Borse | 156/646 |
| 5,094,915 | 3/1992 | Subramaniam | 423/446 |

FOREIGN PATENT DOCUMENTS

| | | | |
|---|---|---|---|
| 1318226 | 5/1992 | Canada. | |
| 2732211 | 1/1978 | Germany | 423/446 |
| 0340993 | 5/1991 | Japan. | |

OTHER PUBLICATIONS

The Properties of Natural and Synthetic Diamond 1992 (no month) pp. 51 and 263–275.
Plastic Deformation and "Work–Hardening" of Diamond 1975 (no month).
Graphitization of Diamond at Zero Pressure and at a High Pressure 1972 (no month).
Chemical Abstracts, vol. 93, No. 24, 1980, Dec. 15, Columbus, Ohio USA.
Chemical Abstracts, vol. 80, No. 6, 1974, Feb. 11, Columbus, Ohio USA.
Chemical Abstracts, vol. 99, No. 10, 1983, Sep. 5, Columbus, Ohio USA.
Soviet Inventions Illustrated, CH section, week 8411, 1984, Apr. 25.
Chemical Abstracts, vol. 111, No. 18, 1989, Oct. 30, Columbus, Ohio, USA.
Chemical Abstracts, vol. 84, No. 14, 1976, Apr. 5, Columbus, Ohio, USA.
Brochure—Utilization of Synthetic Diamond in High Temperature Metal Bonds Turzo et al. no date.

*Primary Examiner*—Michael L. Lewis
*Assistant Examiner*—Stuart L. Hendrickson

[57] ABSTRACT

The purity and toughness of a batch of diamond grains is increased by separating a portion containing undesirable inclusions form a remaining higher purity portion and annealing the higher purity portion in a reducing atmosphere for a sufficient period of time to enhance the toughness of the higher purity portion.

21 Claims, 1 Drawing Sheet

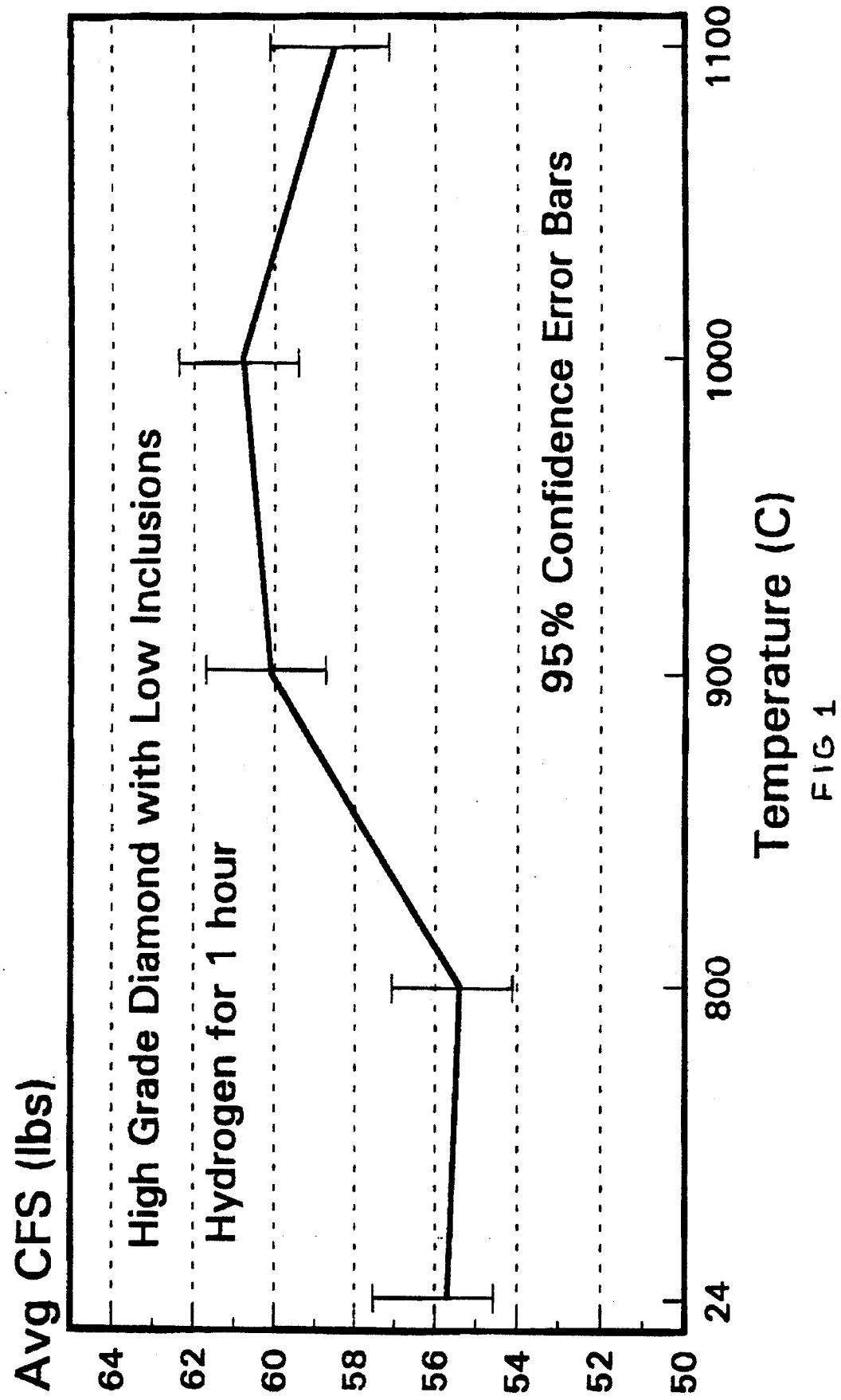

5,523,071

METHOD FOR ENHANCING THE TOUGHNESS OF MANUFACTURED DIAMOND

This is a continuation of Ser. No. 08/105,537 filed on Aug. 11, 1993 now abandoned.

TECHNICAL FIELD OF THE INVENTION

The present invention relates to a process of treating diamond grains which are used for diamond tools.

BACKGROUND OF THE INVENTION

Diamond grains are typically used for the production of diamond tools such as grinding wheels, dressing or truing tools for grinding wheels, and saw blades.

To function effectively and efficiently in certain tool applications, particularly applications requiring diamond saw blades, diamond grit having the highest strength (including high temperature strength), toughness, and abrasion resistance is often desirable. Techniques for bonding diamond to saw blades include the utilization of nickel, cobalt, iron, and other metals and/or alloys for sintering at elevated temperatures from 600 to approximately 1300 degrees Centigrade. At these temperatures, the strength of the diamond may deteriorate. In a vacuum, mild surface graphitization of diamond begins at temperatures above about 1000 degrees Centigrade. In air, diamond will begin to oxidize at about 600 degrees Centigrade. At temperatures above 900 degrees Centigrade, catalyst residues can lead to the regraphitization of diamond or partial disintegration of the crystal due to the relatively large thermal expansion of these metal residues.

U.S. Pat. No. 5,035,771 to Borse describes a process where diamonds in a iron, cobalt, or nickel powder are exposed to a hydrogen atmosphere at a temperature above 700 degrees Centigrade to etch pores in the surface of the diamond to give a roughened surface for enhancing the bonding of the diamond to a saw or grinding wheel. As set forth in column 4, lines 50 to 52, temperatures above 900 degrees Centigrade are disadvantageous because the internal strength of the diamonds is reduced. U.S. Pat. No. 4,174,380 to Strong et al relates to annealing diamond at a temperature ranging from 1500 to 2200 degrees Centigrade under a pressure which prevents graphitization. This process was designed not to improve diamond strength, but rather to aggregate atomically dispersed nitrogen to change the diamond color properties.

A number of researchers have attempted to improve grit diamond strength by heat treating (see Field, 1992, for overview),. Dyer and Conradi (1972) report reducing the toughness index (TI) and thermal toughness index (TTI) test strengths of synthetic diamond after heating to 1400 K. Muhkin et al (1974) and Simkin (1982) also reported strength loss in heating synthetic diamond. Uvarov et al (1974) reported a strength increase for natural diamond as measured by uniaxial compression test upon heating at temperatures between 1300 and 1,880 degrees Kelvin.

The focus of the prior art is that high temperature treatment of diamonds in various gaseous atmospheres must be performed under very carefully controlled conditions to avoid degradation of diamond. Hence, any process for treating diamond grit of the type use for diamond tools which results in increased strength as measured by toughness and strength test represents an advance in the art.

BRIEF SUMMARY OF THE INVENTION

It is an object of the present invention to increase the strength of synthetic diamond grit for use in tools.

It is an object of the present invention to increase the strength of synthetic diamonds by thermal treatment.

It is an object of the present invention to treat diamond grit prior to being utilized in tools, such as by metal bonding processes, to increase the strength of diamond grit.

Another, object of the present invention is to provide a method for increasing the toughness index (TI), thermal toughness index (TTI), and compression fracture strength of synthetic diamond.

Other any further objects of the present invention will become apparent from the following description.

In accordance with the present invention, there is provided a process for increasing the purity and toughness of a batch of diamond grains having inclusions comprising the steps of separating a portion of said grains comprising inclusions from a remaining higher purity portion, and annealing the higher purity portion in a reducing atmosphere for a sufficient period of time to enhance the toughness of the higher purity portion.

BRIEF DESCRIPTION OF THE DRAWING

The only Figure, FIG. 1, shows the effect of temperature on diamond strength with CFS, compressive fracture strength, shown along the y-axis and the annealing temperatures shown along the x-axis. Note the CFS shown at the ambient temperature 24 degrees Centigrade is for a sample prior to annealing.

DETAILED DESCRIPTION

The starting diamond grit utilized in the process of the present invention is a synthetic diamond usually made by a high pressure-high temperature process wherein pressures greater than about 45 kilobar are combined with temperatures exceeding 1200 degrees Centigrade in the carbon P-T region where diamond is the thermodynamically preferred phase. A variety of diamond crystals can be produced.

The indirect or catalyst/solvent process for producing diamond is flexible. By suitable choice of growing parameter, such as the particular combination of pressure, temperature and chemical environment, the growth rate of the diamond crystals can be varied and controlled over a range of several orders of magnitude. As is often the case in growing crystals of other substances, high growth rates in diamond produce crystals with more faults than do slower growth rates. The defects in the crystals are of several kinds: faults in the crystal lattice itself; twinning and random inter-growth; and, substitutional or entrappead non-carbon atoms dispersed atomically or as gross inclusions. Since the diamond is grown with the aid of molten catalyst, the inclusions commonly contain these catalyst materials.

It is contemplated that the process of the present invention is suitable for use with a variety of starting diamond grains. The commercially available diamond abrasive grains are available at various strengths and toughness. Variations in growth rate during manufacture is one factor that may be utilized to control the properties of the diamond abrasive grain. A perfect diamond crystal is likely to have more regular cleavage and wear. Crystal faults or inclusions lead to irregular microfracture and microhardness variations.

Low inclusion, high strain diamond is a preferred diamond for use in accordance with the present invention. Such diamond are typically transparent, yellow to yellow-green single crystals that have essentially symmetric cubo-octahedral morphology. The crystal faces are smooth and without a significant degree of etching. The absence of critical surface flaws is partially responsible for the great strength of these crystals which is desirable in certain cutting applications. Typically the diamond grains utilized in the such cutting application have a particle size from about 150 to about 850 microns preferably from about 300 to about 425 microns.

The starting grit or diamond grains are processed to remove a portion containing undesirable inclusions. Grains having magnetic inclusions which may undesirably cause a volume expansion when heated are separated. Typical undesirable inclusions comprise nickel, iron, or cobalt which may be utilized in diamond manufacture as catalyst. By subjecting the starting grit to a magnetic field of sufficient strength, magnetically attracted diamond grains containing the undesirable inclusions may be separated from a remaining higher purity portion with less inclusions of deleterious materials.

The remaining higher purity portion is annealed in a reducing atmosphere for a sufficient period of time and at a sufficient temperature and pressure to relieve defects in the diamond lattice thereby enhancing the toughness the diamond grains making the grains less likely to fracture. It is theorized that the present invention reduces the residual diamond lattice strain and partially heals lattice dislocations. The time, temperature, pressure, and atmosphere conditions necessary to improve strength are dependent on the type of inclusions in the diamond grains and the strain and dislocations present in the diamond prior to treatment. Diamond grains with less strain and dislocations tend not to have strength enhanced to the extent that strength is enhanced in grains with more strain and dislocations.

In accordance with the principles of the present invention, the remaining portion of higher purity diamond grains is treated by annealing in a non-oxidizing atmosphere at a suitable temperature and time. Annealing is performed under conditions which avoid etching of the surface of the diamond grains. Oxidizing atmospheres are avoided. Contact with materials that may catalyze the conversion of diamond to graphite, i.e. iron, nickel, and cobalt, is avoided. Preferably the atmosphere comprises a reducing gas. More preferably the reducing gas comprises hydrogen. Hydrogen and mixtures of hydrogen and inert gases are preferred. Typical inert gases are nitrogen and the noble gases helium, neon, argon, and xenon. Nitrogen and argon are preferred inert gases. The preferred gaseous atmosphere consist entirely of hydrogen and the inert gas. The volume percent of hydrogen may be varied widely provided the non-oxidizing properties of the annealing atmosphere are maintained. Preferable concentrations of hydrogen are from 2 to 100 volume percent.

Preferred annealing temperatures are from 800 to 1600 degrees Centigrade. Higher temperatures tend to promote diamond degradation due to thermal expansion mismatch and back conversion of diamond to graphite. Lower temperatures tend to require undesirably long annealing times due to slow kinetics. Annealing times are suitably selected and are dependent on the annealing temperature with longer times being desirable for lower temperatures. Preferred annealing times are from about 5 minutes to about 10 hours. The pressure is not critical and can vary within a wide range from a vacuum up to diamond forming pressures. Higher pressures and shorter time periods are preferred for diamond grains that have relatively higher levels of inclusions.

The starting diamond grains preferably have uncoated surfaces. It is intended that the process of the present invention be utilized to increase the strength and fracture toughness of a batch of diamond prior to coating for subsequent attachment to a tool.

Comparisons of diamond friability and toughness may be conveniently measured, before and after treatment in accordance with the process of the present invention conventional methods. These entail placing a small sample of diamond grit in a container, such as a capsule with a means for crushing the grains, such as a steel ball, present therein. More particularly, a toughness index (TI) for a batch of diamond grains is determined by placing 2 carats of material in a capsule with a steel ball, agitating it vigorously for a fixed amount of time, and measuring the weight of fragments produced of a certain size with respect to a certain starting weight of a certain size. Effectively, this method fractures the weakest grains in the sample. Such changes in the physical integrity of the diamond before and after exposure to elevated temperatures is determined as set forth above in the WIG-LBUG apparatus or FTU (friability toughness unit).

The compressive fracture strength (CFS) may be measured by compressively fracturing a population of diamond grains both before and after treatment in accordance with the process of the present invention. One such technique is described in U.S. Ser. No. 08/016,638 which utilizes an apparatus having a pair of hard counter-rotating rollers adapted with a means to measure the compressive force applied by the rollers to grains passing between the rollers at the moment of grain fracture. Such a description of an apparatus as disclosed therein is incorporated by reference into the present specification as an example of how to determine the fracture strength of a population of diamond grains. The motion of one of the rollers is measured by a suitable transducer such as a linear voltage differential transformer to generate an electric signal proportional in voltage to the deflection of the roller and hence proportional to the compressive force on the diamond grain.

The annealed high purity portion having enhanced toughness, may be further processed according to conventional techniques to effect bonding of the diamond grit to a tool, such as preferably a diamond saw. A preferred technique for bonding uses tungsten, nickel, cobalt, iron and copper and their alloys at elevated temperatures from 600 to 1300 degrees Centigrade as a bonding agent.

By way of example, the starting batch of diamond is a high grade synthetic diamond having low levels of magnetic inclusions, a cubo-octahedral morphology, a characteristic yellow color, and a particle size of about 300 to 400 microns. The starting batch is subjected to magnetic separation at a field strength of 8 to 10 kilogauss approximately 2 to 3 millimeters from a magnet. The device used is available from Carpeo Co. and uses a spinning magnet wheel to propel the diamond grains and effect the separation. About 5 to 10 percent of the starting batch is separated from a resulting higher purity portion using this technique. Toughness measurements are performed by TI and CFS test as previously described. The high purity diamond portion is divided into five portions. As shown in the graph, the CFS of a one sample was measured prior to annealing. For convenience, this sample is shown on the graph at 24 degrees Centigrade which is representative of ambient temperature. The remaining four samples were annealed at the respective temperatures, 800, 900, 1000, and 1100 degrees Centigrade as shown in the graph. Annealing was performed by loading the respective sample of diamond grains into a porous alumina crucible and annealing in a pure hydrogen atmosphere for one hour at the respective temperatures. In each case, the temperature was ramped to the high temperature over a time period of about 30 minutes. Similarly, the sample was cooled or quenched from the high temperature to ambient temperature over a similar time period. The toughness of the resulting diamond as measured by CFS is as shown in the graph for the respective sample. For the diamond annealed at 1000 degrees Centigrade, the toughness is about 10 percent higher than the toughness of the batch of separated starting diamond. Toughness is a property normally decreases with increasing levels of inclusions and defects. The resulting batch comprises diamonds with less defects.

We claim:

1. A process for increasing the purity and toughness of a batch of diamond grains in the form of individual crystals wherein a portion of said crystals has inclusions in the form of a magnetic material comprising cobalt, nickel or iron, and said process comprising the steps of first separating at least a portion of said grains comprising inclusions from a remaining higher purity portion, and next annealing said higher purity portion in a reducing atmosphere for a sufficient period of time to enhance the toughness of said higher purity portion, whereby the diamond grains have at least 10% increase in toughness.

2. A process for increasing the purity and toughness of a batch of diamond grains according to claim 1 wherein said batch of diamond grains comprises a synthetic diamond.

3. A process for increasing the purity and toughness of a batch of diamond grains according to claim 2 wherein said batch of diamond grains is made by a high pressure-high temperature process wherein pressures greater than about 45 kilobar are combined with temperatures exceeding 1200 degrees Centigrade in the carbon P-T region where diamond is the thermodynamically preferred phase.

4. A process for increasing the purity and toughness of a batch of diamond grains according to claim 3 wherein said batch of diamond grains comprise strained diamond.

5. A process for increasing the purity and toughness of a batch of diamond grains according to claim 3 wherein said batch of diamond grains comprise transparent, yellow to yellow-green single crystals having essentially symmetric cubo-octahedral morphology.

6. A process for increasing the purity and toughness of a batch of diamond grains according to claim 5 wherein said batch of diamond grains are smooth.

7. A process for increasing the purity and toughness of a batch of diamond grains according to claim 5 wherein said batch of diamond grains is characterized by absence of surface flaws.

8. A process for increasing the purity and toughness of a batch of diamond grains according to claim 6 wherein said diamond grains in said starting batch have a particle size from 150 to 850 microns.

9. A process for increasing the purity and toughness of a batch of diamond grains according to claim 8 wherein said batch of diamond grains processed to remove a portion containing inclusions which may cause a volume expansion when heated are separated.

10. A process for increasing the purity and toughness of a batch of diamond grains according to claim 5 wherein said inclusions comprise nickel, iron, or cobalt.

11. A process for increasing the purity and toughness of a batch of diamond grains according to claim 10 wherein said batch of diamond grains is subjected to a magnetic field of sufficient strength to magnetically attracted diamond grains containing the inclusions and separate said portion containing inclusions from a remaining higher purity portion of diamond grains.

12. A process for increasing the purity and toughness of a batch of diamond grains according to claim 11 wherein said batch of diamond grains is annealed in a reducing atmosphere for a sufficient period of time and at a sufficient temperature and pressure to relieve defects in the diamond lattice thereby enhancing the toughness the diamond grains making the resulting grains less likely to microfracture.

13. A process for increasing the purity and toughness of a batch of diamond grains according to claim 12 wherein said batch of diamond grains is annealed in a reducing gas.

14. A process for increasing the purity and toughness of a batch of diamond grains according to claim 13 wherein said reducing gas comprises hydrogen.

15. A process for increasing the purity and toughness of a batch of diamond grains according to claim 13 wherein said reducing gas comprises a mixture of hydrogen and an inert gas.

16. A process for increasing the purity and toughness of a batch of diamond grains according to claim 15 wherein said inert gases comprises nitrogen, argon, helium and mixtures thereof.

17. A process for increasing the purity and toughness of a batch of diamond grains according to claim 15 wherein said annealing temperature is from 800 to 1600 degrees Centigrade.

18. A process for increasing the purity and toughness of a batch of diamond grains according to claim 17 wherein said annealing time is from about 5 minutes to about 10 hours.

19. A process for increasing the purity and toughness of a batch of diamond grains according to claim 17 wherein the friability and toughness of said starting batch and said higher purity remaining portion is measured.

20. A process for increasing the purity and toughness of a batch of diamond grains according to claim 19 wherein said measurement comprised placing said starting batch of diamond grains in a container including means for crushing the grains, agitating, and measuring the weight of fragments produced.

21. A process for increasing the purity and toughness of a batch of diamond grains according to claim 20 wherein said measurement comprises compressively fracturing a population of diamond grains before both before and after annealing by measuring the compressive force applied by a pair of rollers to crush grains passing between the rollers at the moment of grain fracture.

* * * * *